United States Patent [19]
Liu et al.

[11] Patent Number: 5,432,803
[45] Date of Patent: Jul. 11, 1995

[54] MAXIMUM LIKELIHOOD CONVOLUTIONAL DECODER

[75] Inventors: Qingli Liu; Xiangyang Chen, both of Calgary; Lise Vanterpool, Ottawa; Andrew Sendyk, Calgary, all of Canada

[73] Assignee: NovAtel Communications, Ltd., Calgary, Canada

[21] Appl. No.: 876,324

[22] Filed: Apr. 30, 1992

[51] Int. Cl.[6] .............................................. G06F 11/10
[52] U.S. Cl. ...................................... 371/43; 371/44; 375/340
[58] Field of Search ................ 371/43, 44, 45; 375/94

[56] References Cited

U.S. PATENT DOCUMENTS

| | | |
|---|---|---|
| 4,583,078 | 4/1986 | Shenoy et al. |
| 4,748,626 | 5/1988 | Wong ............................ 371/43 |
| 4,763,328 | 8/1988 | Shimoda et al. .............. 371/43 |
| 4,802,174 | 1/1989 | Hiraiwa et al. ............... 371/46 |
| 4,823,346 | 4/1989 | Kobayashi et al. ........... 371/43 |
| 4,868,830 | 9/1989 | Pollara-Bozzola ............ 371/43 |
| 4,919,446 | 4/1990 | Yagi ............................... 371/46 |
| 4,933,956 | 6/1990 | Forney, Jr. ................... 371/43 |
| 5,220,570 | 6/1993 | Lov et al. ...................... 371/43 |
| 5,272,706 | 12/1993 | Park .............................. 371/43 |
| 5,280,489 | 1/1994 | Fredrickson et al. ........ 371/45 |
| 5,291,524 | 3/1994 | Itakura et al. ................ 375/94 |
| 5,295,142 | 3/1994 | Hatakeyama ................. 371/43 |

OTHER PUBLICATIONS

Hekstra "An Alternative to Metric Rescaling in Viterbi decoders" IEEE 1989 pp. 1220, 1222.

Primary Examiner—Robert W. Beausoliel, Jr.
Assistant Examiner—Albert Decady
Attorney, Agent, or Firm—Cesari and McKenna

[57] ABSTRACT

A maximum likelihood decoding system includes a branch metric processor which calculates only one of four branch metrics associated with branches leading to two consecutive states $S_j$ and $S_{j+1}$, where j is even. The system determines the remaining three metrics by producing a second branch metric by manipulating the first branch metric using simple binary operations and assigns the first and second metrics to the second and first branches, respectively, leading to the odd state. The system next retrieves associated path metrics from a path metric memory which stores the information in locations accessed by addresses related to identifiers associated with the branch initial states. After the system selects a surviving path for each end state, it stores in a path memory location associated with the end state information identifying the previous state on the surviving path. Thereafter, during trace back, the system uses the identifier of a known end state to address the path memory and retrieve the information identifying a previous state on the path. The system assigns data values to the branches of the most likely path as soon as it identifies the states on the path, since all branches leading to an even state are associated with a "ZERO" data bit and all branches leading to an odd state are associated with a "ONE" data bit.

49 Claims, 12 Drawing Sheets (a)

(b)

MAXIMUM LIKELIHOOD CONVOLUTIONAL DECODER

FIELD OF THE INVENTION

The invention relates to convolutional code decoders and, in particular, to maximum likelihood decoders.

BACKGROUND

Data are typically encoded before transmission to a receiver or to a storage device, to protect the data from errors which may result from a noisy communications channel or a defect in the storage medium. An encoder manipulates data symbols in accordance with an error correction code and produces error correction symbols. If the error correction code is systematic, the encoder forms a code word by appending the error correction symbols to the applicable data symbols. If the error correction code is non-systematic, the encoder forms the code word using only the error correction symbols. In either case, the code word is transmitted or stored. When the code word is later received or retrieved it is decoded to reproduce the data symbols, and errors in the data symbols are corrected, if possible, using the error correction symbols.

One error correction code that is particularly well suited to the correction of multiple errors is a non-systematic convolutional code. An encoder encoding data in accordance with an (n,k,m) convolutional code produces for k data symbols an n-symbol code word, which is a rate k/n code. The n-symbol code word is based on the k data symbols and, also, on m previously encoded data symbols, where m is called the "memory order" of the encoder. The convolutional encoder thus includes m stages of memory, for example, m one-symbol shift registers, and the contents of the m registers at the time when the k data symbols are applied to the encoder affect in a predetermined manner the code word generated by the encoder.

The m shift registers are updated each time the encoder produces a code word. The m registers are essentially a finite state machine which changes state based on the data applied to the encoder. In an encoder of interest, one data symbol (k=1) is encoded using a binary code to produce a two-symbol code word (n=2) and the registers change state by including in a first register the data symbol and shifting the contents of the remaining registers. The data thus affects the encoding of m+1 code words since the data remains in the registers until they have shifted m times. The code has a "constraint length" of K=m+1.

One method of decoding code words encoded using an (n,k,m) convolutional code is commonly referred to as maximum likelihood decoding. This type of decoding, in essence, involves finding for a stream of received or retrieved code words a most likely stream of error free code words, and then, determining for these error free code words the associated data symbols. Maximum likelihood decoding works particularly well with code words of non-systematic convolutional codes.

One kind of maximum likelihood decoder is commonly referred to as a Viterbi decoder. Conceptually, a Viterbi decoder uses a decoding trellis, which has a branch for each possible code word and connected paths of branches for each possible stream, or sequence, of code words. The decoder essentially finds a path through the trellis which is "closest" to, or most like, the received stream of code words. It then treats the code words on this "most likely" trellis path as the received code words and assigns data values to them, to produce a best estimate of the transmitted data.

To determine the most likely path, the decoder calculates, for each received code word, a set of branch metrics. A branch metric is a numerical representation of the likelihood that the transmitted code word, which may contain errors on reception, is actually the code word which corresponds to a particular branch. In one such decoder the branch metrics are the Hamming distances between the received code word and the code words associated with the various branches.

FIG. 1 depicts a decoding trellis for a rate $\frac{1}{2}$ code as discussed above. The code generates for each data symbol (k=1) a two-symbol code word (n=2). The memory order of the code is two (m=2), and thus an associated encoder includes two shift registers. The code is binary, and each symbol is one bit in length. The possible code words are represented in the decoding trellis by branches, for example, branches labeled 2-5. The branches depicted as solid lines represent code words associated with a data ZERO and the dashed lines represent code words associated with a data ONE.

Each branch in the decoding trellis leads from an initial state, which represents the state that the m registers are in prior to the formulation of the code word associated with the branch, and leads to an end state, which represents the state that the m registers are in after the formulation of the code word. Thus branch 2 represents a code word 00 produced by the encoding of a ZERO data bit with the registers in state 00. The branch leads from state 00 to state 00. Branch 3 represents a code word 11 produced by the encoding of a ONE data bit with the registers in state 00. The branch leads from the initial register state 00 to an end state 01. The initial state associated with a branch is considered in a decoding level which precedes the decoding level of the end state.

For a binary code there are $2^{K-1}$, or $2^m$, possible states associated with each decoding level, where K is the constraint length of the code. In the example, the code has a constraint length of 3, i.e., there are 2 registers, and there are thus $2^2$ possible register states, namely, 00, 01, 10, 11, in each decoding level. Since the code is a rate 1/n code, i.e. k=1, there are two possible branches leading from each initial state, namely a branch associated with a ZERO data bit and a branch associated with a ONE data bit. Each of these branches necessarily leads to a different end state. Thus for each of the $2^{K-1}$ states in a given decoding level, there are two branches leading to each of these states, and each branch may represent the transmitted code word. Accordingly, to decode the code word the decoder must determine two branch metrics for each of the $2^{K-1}$ possible end states, or a total of $2(2^{K-1})$ branch metrics.

Once the decoder calculates these branch metrics, it next determines the metrics of the various paths leading to the end states. Accordingly, the decoder adds to the branch metrics the appropriate path metrics, which are the sums of the branches leading to the initial states. The decoder then selects a most likely path leading to each of the end states and stores for later use the path metrics and information which identifies these most likely paths. These most likely paths which are also referred to as the "surviving paths." The decoder does not retain information relating to the less likely, or non-surviving, paths. In this way, the decoder "prunes" these paths from the trellis, and thereby eliminates for a next level of decoding a portion of the path metric calculations.

When a sufficient number of code words have been included in the trellis paths, the most likely code word path is chosen from the surviving paths associated with the end states. The decoder selects as the most likely path the code word path which is "closest" to the received data, i.e., the path with the smallest Hamming distance metric. The decoder then decodes the code words on the most likely path, or "traces back" along the path, to determine the associated data bits.

Prior decoders perform, for each of the $2^{K-1}$ possible end states, $2^k$ branch metric calculations, one for each branch leading to the state; $2^k$ path metric access operations, to retrieve previously calculated path metrics; $2^k$ addition operations, to add the branch metrics to the retrieved path metrics; a surviving path selection operation; a surviving path identifier storage operation; and a path metric storage operation. Each of the branch metric calculations is typically time consuming and/or requires a relatively large look-up table. Also, each of the storage operations typically requires a relatively large memory, since for each state, at a minimum, the memory must hold (i) the branch metrics associated with each branch, (ii) information which identifies the surviving paths, (iii) the surviving path metrics and (iv) the data values associated with the branches on each of the surviving paths must be stored.

SUMMARY OF THE INVENTION

The inventive maximum likelihood decoding system includes a branch metric processor which calculates for the $2^{K-1}$ end states only certain of the branch metrics and from these calculated metrics determines, relatively easily, the remaining branch metrics. The processor relies on complementary properties of convolutional codes to simplify the branch metric calculations. Further, the system stores only a portion of the branch metric information, and thus, utilizes a smaller memory.

For a rate 1/n code there is a fixed relationship between the branch metrics of branches ending in consecutive even and odd states of the decoding trellis. The system produces these four branch metrics by first calculating a single branch metric, and then, determining from this calculated branch metric the remaining three metrics using simple binary operations, as discussed in more detail below.

The inventive system also relies on the complementary properties of the code to simplify an addressing scheme for its path metric memory. It bases the addresses on end state identifiers, and thus, it quickly locates the stored information. The system also bases its addressing scheme for accessing information which identifies the states along the surviving paths on the end state identifiers, and thus, simplifies the operation of tracing-back along the most likely path. Further, the addressing scheme has "encoded" in it the data values associated with the various branches on the path. Accordingly, the system does not separately store data value information, as is required in known prior systems.

The decoder calculates for each set of two consecutive even and odd states a first branch metric, b. It then stores the calculated branch metrics in a $2^{K-2}$ element look-up table. Thereafter, the system determines the four branch metrics for each set of even and odd states by retrieving the stored branch metric, b, associated with the even state and calculating the remaining branch metric for the even state by (i) if the decoder is a hard decision decoder, subtracting the retrieved branch metric from n—the second branch metric is thus n-b; or (ii) if the decoder is a soft decision decoder, negating the first metric—the second metric is thus -b. The decoder then interchanges the metrics and uses them for the odd state. The odd state metrics are thus, respectively, n-b and b, or -b and b.

Once the branch metrics are determined, the system retrieves from a path metric memory the path metrics associated with the paths leading to the initial states of the branches and updates the metrics for the various paths leading to the end states by adding to them the appropriate branch metrics. The path metric memory is organized such that the path metrics associated with a given end state are stored in locations which have addresses that can be determined from an identifier associated with that state, if the state is even, or with the related even state if that state is odd. If, for example, the end state is state $S_j$, where j is 0 or even, the addresses associated with the path metrics are based on the identifiers of the related initial states, namely, $S_{[j/2]}$ and $S_{[j/2]}+2^{K-2}$, where [] indicates the integer portion of the quotient. Since these initial states are also the initial states for the branches leading to the associated odd state, the system accesses the path metric memory only twice while it calculates the four path metrics for the branches leading to the consecutive end states.

After the updated path metrics are calculated, the system selects a surviving path for each end state. The system then stores information identifying the previous state on the surviving path in a path memory location associated with the end state. Thereafter, when the system is tracing back along the most likely path, it uses the identifier of a known end state to address the path memory and retrieve the information identifying a previous state on the path. From this information the system formulates a next address for the path memory and retrieves information identifying the next earlier state on the most likely path, and so forth. Also, since all branches leading to an even state are associated with a "ZERO" data bit and all branches leading to an odd state are associated with a "ONE" data bit, the system assigns data values to the branches of the most likely path as soon as it identifies the states on the path. Accordingly, the system does not require a separate memory to store for each branch the associated data value.

BRIEF DESCRIPTION OF THE DRAWINGS

The above and further advantages of the invention may be better understood by referring to the following description in conjunction with the accompanying drawings, in which:

FIG. 10b illustrates a two-layered trellis for the (n-1)/n rate code;

DETAILED DESCRIPTION

Figure 1:
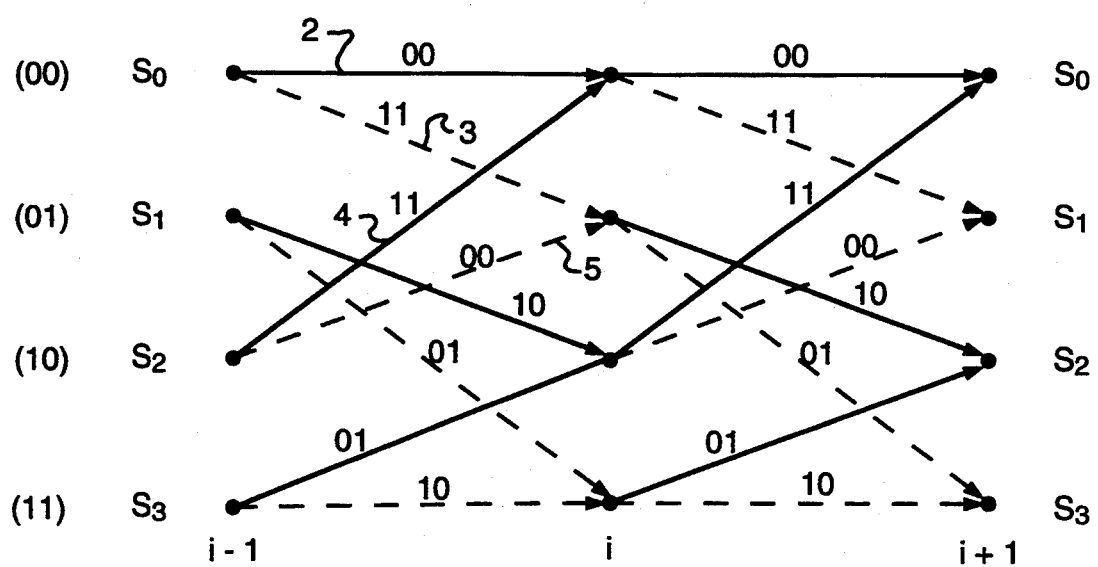
FIG. 1 is an illustration of a decoder trellis used in maximum likelihood decoding.
Figure 2:
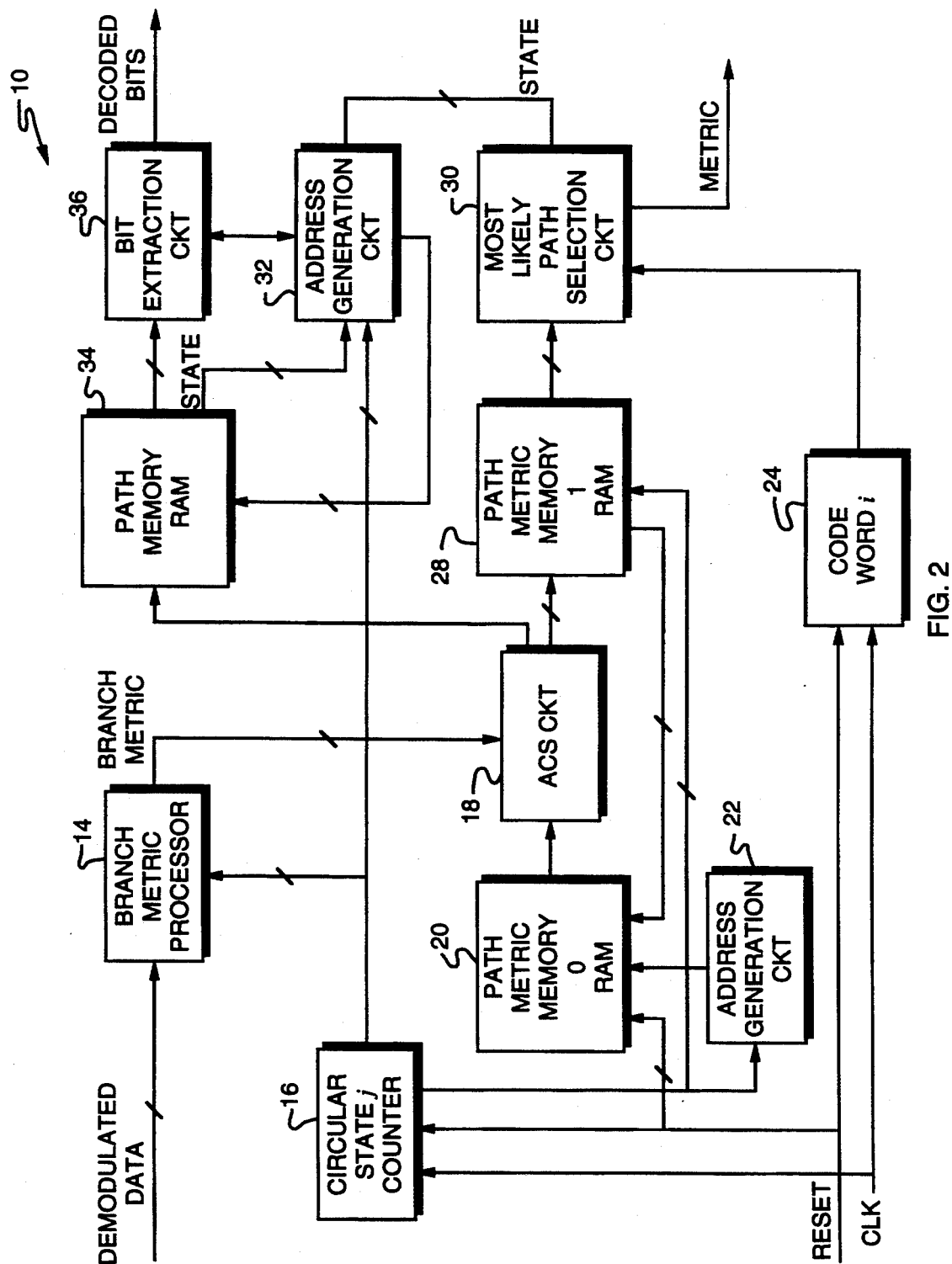
FIG. 2 is a block diagram of a maximum likelihood decoding system constructed in accordance with the invention.

FIG. 2 depicts in block diagram form a maximum likelihood decoder 10. The decoder decodes data which has been encoded using an (n,k,m) convolutional code. An exemplary code is the (2,1,2) code discussed above with reference to FIG. 1.

Transmitted code words are applied to a branch metric processor 14 for decoding. For each code word, a state counter 16 supplies to the branch metric processor 14 an identifier associated with a first even state $S_j$, where j=0. This state corresponds to the registers holding all ZERO bits, as depicted in FIG. 1. The branch metric processor 14 produces in response two branch metrics, $b_{j1}$ and $b_{j2}$, as discussed in more detail with reference to FIG. 3.

The branch metric processor 14 applies the two branch metrics to an add, compare and select (ACS) circuit 18, which treats them as the branch metrics for both state $S_j$ and state $S_{j+1}$, as explained below. An address generation circuit 22 generates from $S_j$ two addresses and applies them to a path metric memory 20 to retrieve the associated path metrics.

The path metric memory, in turn, supplies to the ACS circuit 18 the path metrics associated with the previous states on paths leading to both state $S_j$ and state $S_{j+1}$, that is, associated with the initial states of the branches leading to these states. The ACS circuit 18 adds the previously calculated branch metrics, $b_{j1}$ and $b_{j2}$, to the retrieved path metrics and selects for states $S_j$ and $S_{j+1}$, respectively, the associated paths with the smallest total metrics. The selected paths are most likely, or surviving, paths. Information identifying these surviving paths and the associated path metrics are then stored in a path memory 34 and a path metric memory 28, respectively, in locations associated with the identifiers $S_j$ and $S_{j+1}$, as discussed in more detail with reference to FIGS. 7 and 9 below.

Once the path metrics for states $S_j$ and $S_{j+1}$ are stored, state counter 16 is updated to a count associated with the next even state, $S_{j+2}$, and the branch metric processor 14 determines the branch metrics for states $S_{j+2}$ and $S_{j+3}$. The ACS circuit 18 next calculates the path metrics for these states and selects for each state a surviving path. The decoder 10 then stores information identifying the surviving paths and the associated path metrics in path memory 34 and path metric memory 28, respectively. The decoder 10 again updates the state counter 16, and continues to calculate and store surviving path identification information and path metrics until it has stored such information for each of the $2^{K-1}$ states associated with the received code word. These states are depicted in FIG. 1 as the states of decoding level L=i.

When the code word state counter 16 reaches its maximum state count, which indicates that the path metrics for every state associated with the code word have been determined, the decoder 10 advances the count of a code word counter 24. The decoder 10 then begins its path metric calculations for a next n-symbol code word, that is, for decoding level L=i+1.

When the code word counter 24 counts a sufficient number, "c," of code words to enable the decoder to select a most likely code word path, typically $c \geq 5K$, it enables a most likely path selection circuit 30. The selection circuit 30 retrieves from path metric memory 28 the path metrics associated with the most recent decoding level and selects the codeword path with the smallest metric. This path, which is the most likely code word path, corresponds to a stream of valid code words which is "closest" to the received data stream. The decoder 10 then traces-back along the selected path and decodes the code words associated with the path branches to produce decoded data symbols.

To identify a previous state on the selected path, the selection circuit 30 applies to address generation circuit 32 an identifier associated with the end state of the selected path. Address generation circuit 32, as discussed in more detail below with reference to FIG. 9, generates an address associated with this end state and applies it to both path memory 34 and an extraction circuit 36. The extraction circuit 36 extracts from the address the least significant symbol, which in this example is a bit, and the decoder 10 treats the extracted bit as the decoded data. At the same time, path memory 34 supplies to address generation circuit 32 the contents of the addressed memory location, and the address generation circuit generates from this information the address of the previous state on the trace-back path. The operation of path memory 34 and the extraction circuit 36 are discussed in more detail below.

Referring again to FIG. 1, it can be seen from the decoding trellis that the branches leading to each set of two consecutive even and odd states, for example, states $S_0$ and $S_1$ or states $S_2$ and $S_3$, start from one of two initial states. Also, the two code words associated with branches leading to the odd state are the same as the code words associated with the branches leading to the even state. Further, the code words associated with the two branches leading to a given state are complements. For example, the code word 00 associated with upper branch 2 leading to end state $S_0$ is the complement of the code word 11 associated with lower branch 4 leading to the same end state. Also, both of these branches 2 and 4, which are depicted as solid lines, are associated with data ZERO bits. Similarly, the code words associated with branches 3 and 5 leading to the consecutive odd state, $S_1$, are complements of each other. As discussed above, these code words are the same as the code words associated with the branches leading to state $S_0$, namely, 00 and 11, although the branches, which are depicted as dashed lines, are associated with data ONE bits.

Branch metrics are a measure of the "closeness" between the received code word and the code words associated with the various branches of the decoding trellis. As discussed above, the decoder in this example uses as the branch metrics the Hamming distances. In a binary system, the Hamming distance is the number of bits by which the received code word and the branch code word differ.

Since the two branches leading to an even state and the two branches leading to the related odd state are associated with the same code words, the branches are also associated with the same branch metrics. Further, since the two code words leading to one of these states are complementary, once a branch metric associated with one of the branches is known, the branch metric for the other branch leading to the same state is either known, or easily calculated. Once both metrics are known, they are simply applied to the branches leading to the related odd state. Accordingly, only one branch metric calculation is performed.

If the decoder is a hard decision decoder, the branch metrics of branches leading to the same state add to n, which is the number of bits in the code word. If the decoder is a soft decision decoder, the branch metrics add to 0, that is, one branch is the negative of the other.

Figure 4:
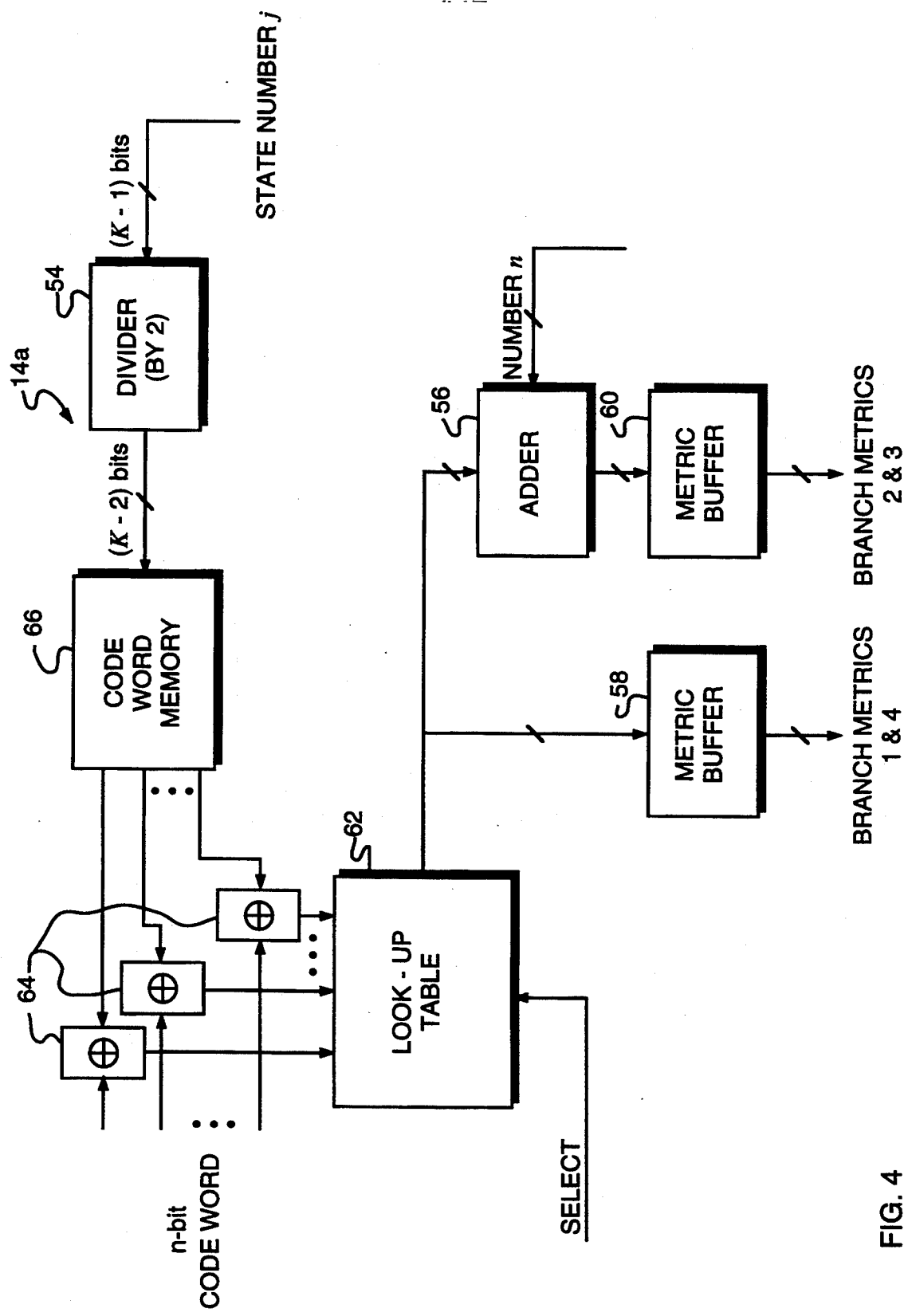
FIG. 4 depicts an alternative embodiment of the branch metric processor of FIG. 3.
Figure 5:
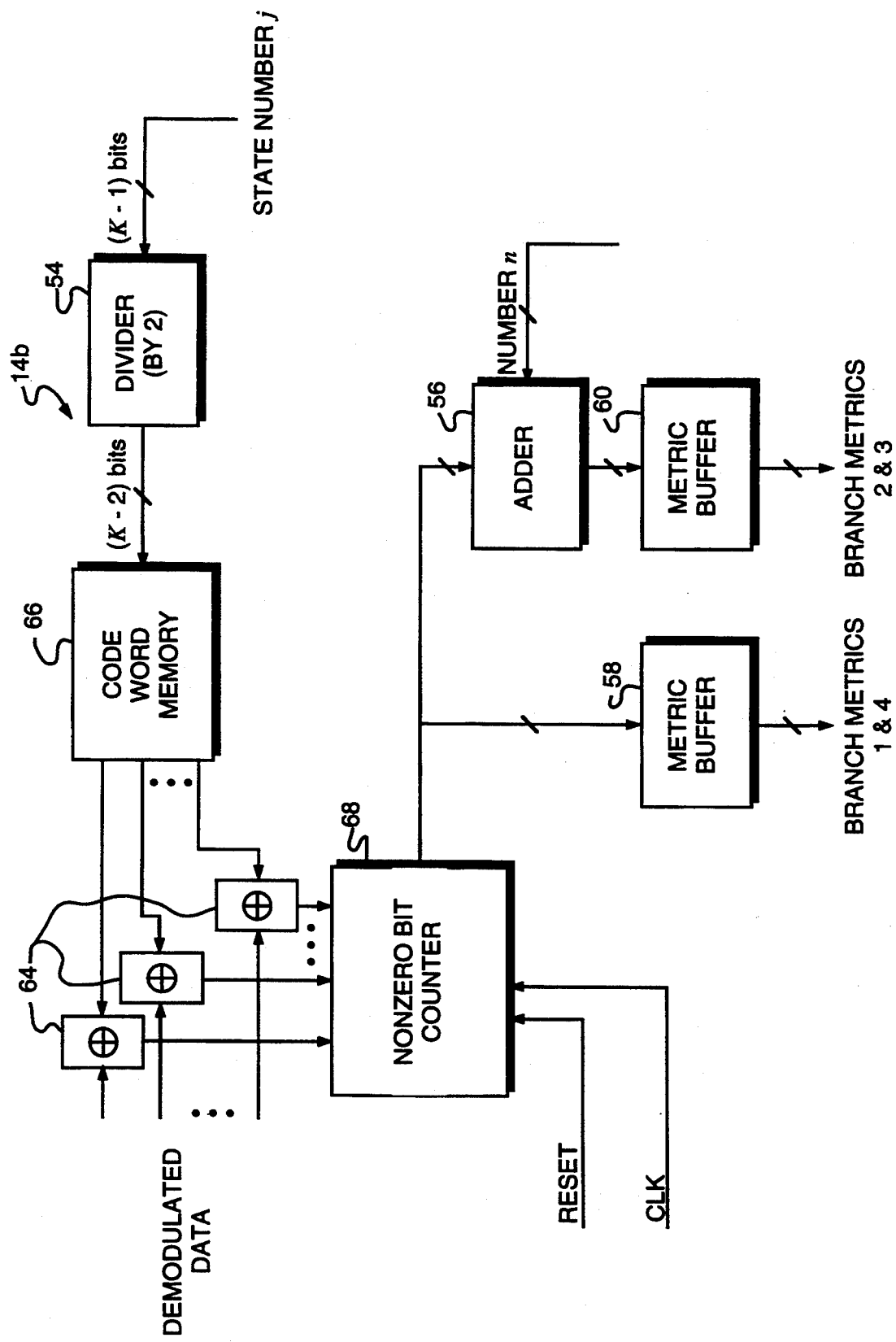
FIG. 5 depicts another embodiment of the branch metric processor of FIG. 3.
Figure 6:
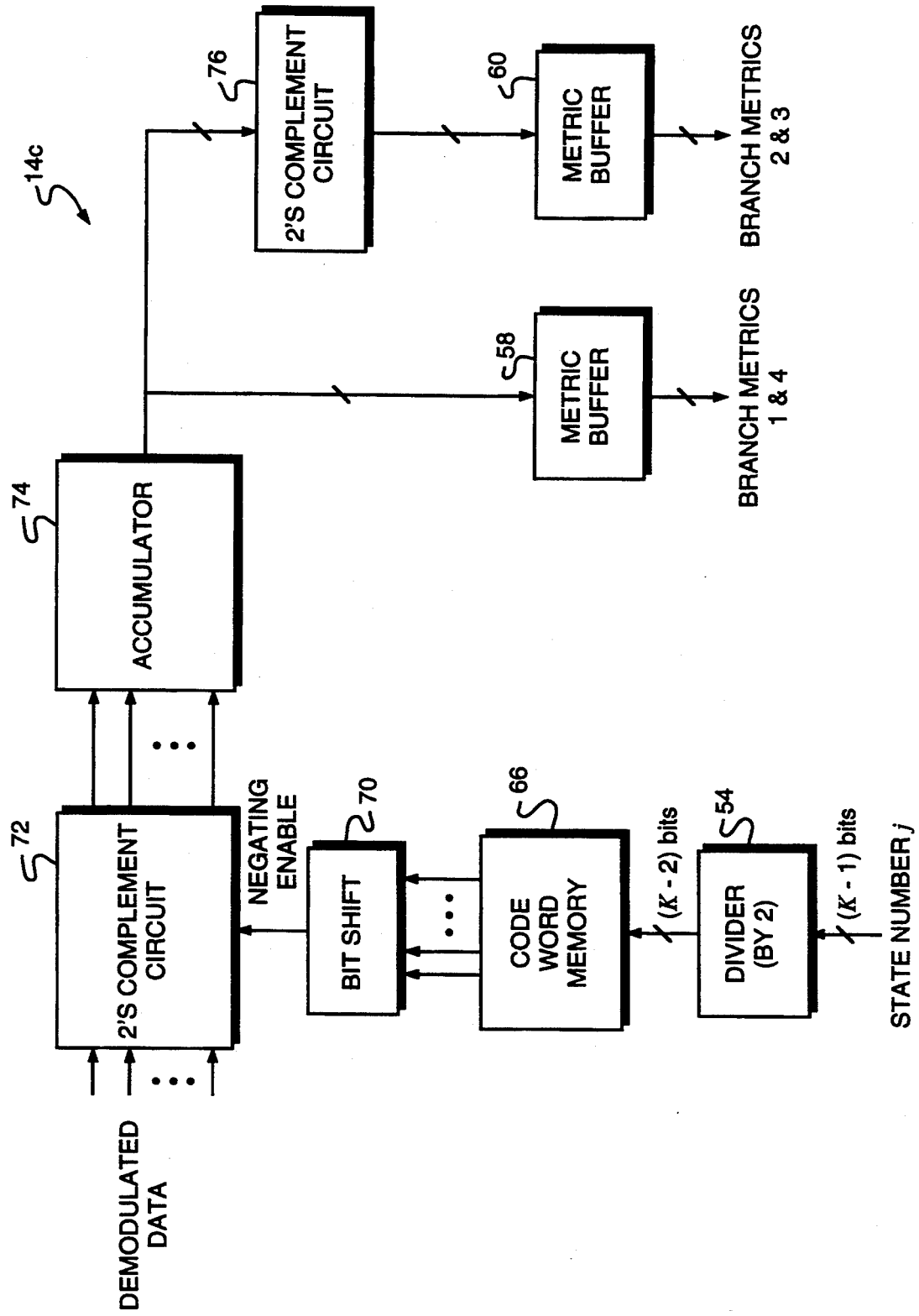
FIG. 6 depicts in block diagram form a branch metric processor for use in soft decision decoding.

The branch metric processor 14 of FIG. 2 takes advantage of the complementary properties of the code and simplifies the circuitry involved in calculating the branch metrics. A branch metric processor 14 for use in hard-decision decoding is depicted in more detail in FIG. 3. Alternative embodiments of the branch metric processor 14 are depicted in FIGS. 4 and 5, as discussed below. A branch metric processor 14 for soft decision decoding is depicted in FIG. 6.

Figure 3:
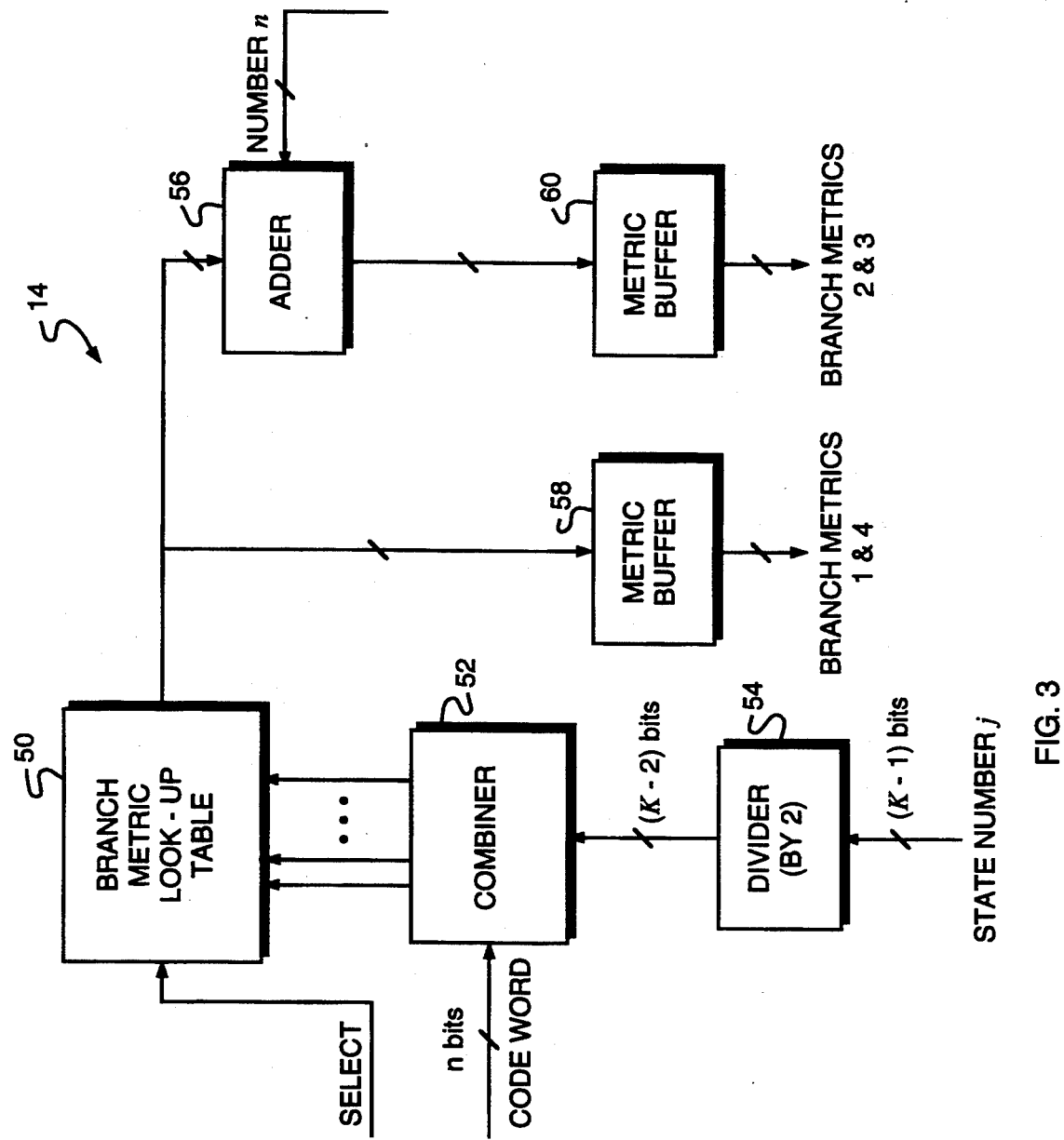
FIG. 3 depicts in block diagram form a branch metric processor for use in hard decision decoding.

Referring to FIG. 3, the branch metric processor 14 includes a $2^{n+K-2}$ element branch-metric look-up table 50. The table contains for each set of two consecutive even and odd states one of the four associated branch metrics for each possible transmitted code word. This table is thus one-fourth the size of the branch-metric table used in prior systems, since the prior systems store in such a table the metrics for all four of the branches and each possible transmitted code word.

The branch-metric table 50 in the preferred embodiment is organized such that the metric associated with an all-ZERO transmitted code word and end state $S_0$, which is the even state associated with the smallest numerical identifier, is stored at a location associated with an all ZERO address, that is, the numerically lowest address. The table stores the metric associated with an all-one code word and the $2^{K-1}-2$ end state, which is the even state associated with the largest numerical identifier, in the location associated with an all ONE address, that is, the numerically highest address. The table is thus organized such that the metrics associated with a given state and a given code word can be easily accessed by a combination of the code word bits and certain bits associated with the state identifier.

To form the table address, a combiner circuit 52 combines the transmitted n-bit code word with K-2 bits associated with the applicable state identifier, $S_j$. A divider circuit 54 produces these K-2 bits by dividing by two the K-1 bit state number, j, to produce the quantity [j/2]. Thus the combiner circuit 52 produces the same address for state $S_j$, where j is even, and state $S_{j+1}$, which corresponds with the association of these metrics with both an even state and a related odd state.

In response to the address from the combiner circuit 52, the branch metric table 50 supplies to a metric buffer 58 and an adder 56 the branch metric which corresponds to the upper branch leading to an even state $S_j$. The metric buffer 58 stores the metric for later use. The adder 56 subtracts the metric from n to produce the metric associated with the lower branch leading to the same state $S_j$. The adder then supplies this metric to metric buffer 60, which stores it for later use. These stored metrics are used in calculating path metrics for the paths leading to the associated even and odd end states, as described in more detail below.

FIG. 4 depicts an alternative embodiment of the branch processor 14, for use in hard decision decoding. The elements of this embodiment which are the same as the elements depicted in the embodiment of FIG. 3 are given the same element numbers. A code word memory 66 contains $2^{K-2}$ code words associated with the upper branches leading to the even states $S_j$, j=0, 2, . . . , $2^{K-1}-2$. For each state $S_j$, divider 54 produces K-2 address bits, which it then applies to the code word memory 66. In response, the code word memory 66 retrieves the n-bit code word which corresponds to the upper branch leading to the associated even state.

The processor 14a compares, or combines, in XOR gates 64 the code word retrieved from the memory 66 and the received code word. The n-bit result of the XOR operation is applied as an address to a $2^n$ element look-up table 62, which contains for each possible result a count of the number of ones, that is, the associated branch metric. The metric is then stored in buffer 58. Adder 56 subtracts the metric from n to produce a second branch metric associated with the same state. This metric is then stored in buffer 60.

As shown in FIG. 5, a non-zero, or ONE, counter 68 may be used instead of the look-up table 62 of FIG. 4. The counter 68 counts the number of ONE bits produced by the combination of the code word associated with a particular branch and the received code word. The count is then stored in buffer 58. Adder 56 subtracts the count from n to produce the second branch metric, which it then applies to buffer 60.

FIG. 6 depicts a branch metric processor 14c for use in soft decision decoding. A branch metric in soft decision decoding is determined by taking the inner product of the received code word and the code word associated with the branch. In binary communications the inner product can be calculated by accumulating, over the n bits of the code word associated with the branch, the value or the negative, or 2's complement, of the value of each bit signal of the received code word, as discussed below.

The code word memory 66, which is addressed by a K-1 bit address produced by divider 54, retrieves from the addressed storage location the code word associated with the upper branch leading to the even state $S_j$. The memory 66 then applies the retrieved code word to a bit shifter 70, which in turn sends to 2's complement circuit 72 various asserted or a de-asserted enable signals based on the values of the individual bits of the retrieved code word.

Specifically, the bit shifter 70 sends to the 2's complement circuit 72 an asserted enable signal if the first bit of the retrieved code word is a 1 and a de-asserted enable signal if the bit is a 0. In response to an asserted enable signal, 2's complement circuit 72 produces the 2's complement of the corresponding bit value of the received code word, which is the negative of the bit value. This negated value is then retained in accumulator 74 as the "accumulated value." In response to a de-asserted enable signal, the 2's complement circuit 72 sends to the accumulator 74 a value which corresponds directly to the first bit of the received code word. The accumulator 74 then retains this value as the accumulated value.

The bit shifter 70 supplies to the 2's complement circuit 72 an enable signal which corresponds to the value of a next bit of the retrieved code word, and again, the 2's complement circuit 72 sends to the accumulator 74 either a value which corresponds to the next bit value of the received code word or to the negative of this next bit value. The accumulator 74 then combines the received bit value with the accumulated value and retains the result as a new accumulated value. After n such operations, the accumulator 74 contains the branch metric associated with the upper branch leading to state $S_j$. The accumulator supplies this branch metric to both metric buffer 58 and 2's complement circuit 76. The buffer 58 stores the metric, while the 2's complement circuit 76 negates the metric to produce the second branch metric. This second branch metric is then stored in buffer 60.

Figure 7:
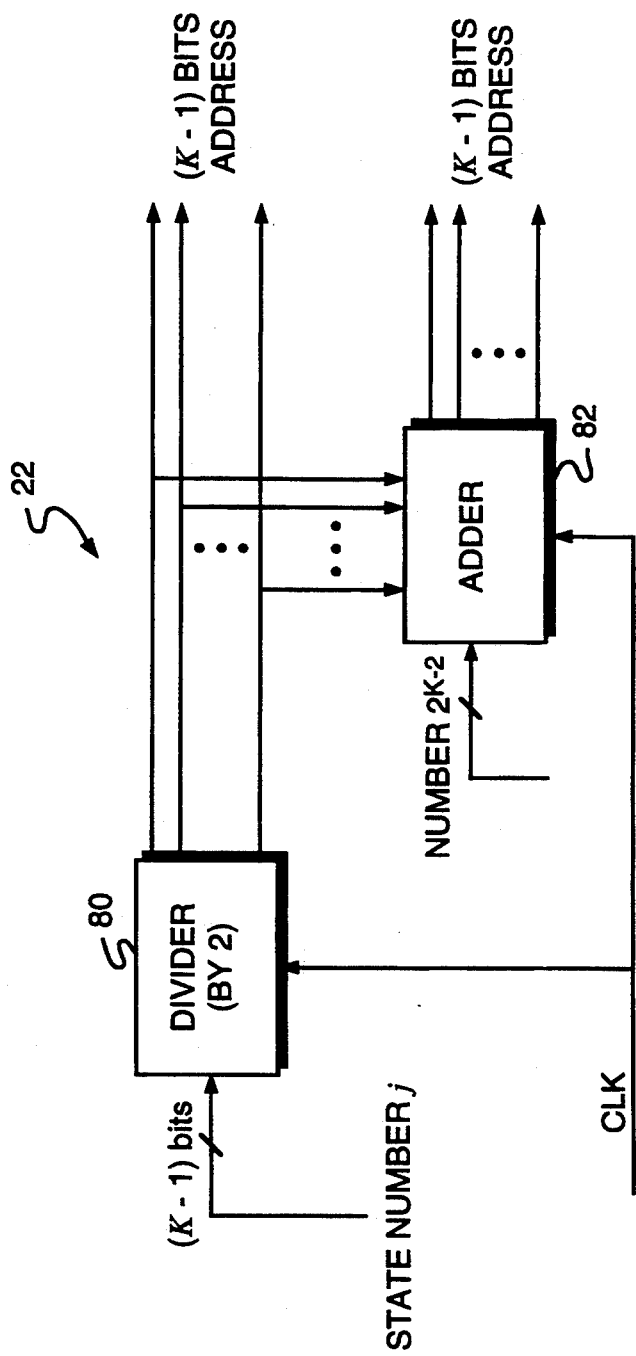
FIG. 7 depicts in block diagram for a path metric memory address generation circuit.

Referring now to FIG. 7, a path metric memory address generation circuit 22 of FIG. 2 is shown in more detail. As discussed above, the state numbers, j, of the initial states of these branches may be determined from the state number of the end state, using relatively simple binary operations. For an end state $S_j$, the state identifier numbers associated with the initial states are, [j/2] and [j/2]+$2^{K-2}$, where [] represents the integer portion of the quotient. In this example, where K=3, the initial states associated with the end state $S_0$ are thus $S_0$, which is [0/2]=0, and $S_2$ which is [0/2]+$2^1$=2. By arranging the path metric memory 20 such that the metrics are stored in locations addressed by the state numbers, the address generation circuit 22 can easily generate the appropriate path metric memory addresses from the state identifier of the appropriate end state.

The path metric memory address generation circuit 22 includes a divider 80, which divides the end state number by 2 and takes the integer value to generate the memory address associated with a first of the two previous states. The divider 80 produces a K-1 bit address, which has K-2 bits corresponding to [j/2] and the most significant bit set to 0. An adder 82 then adds to these K-1 bits the quantity $2^{K-2}$, to generate the path metric memory address associated with a second previous state. The adder 82 thus sets the most significant bit of the K-1 bits to a 1 to produce the second address.

Figure 8:
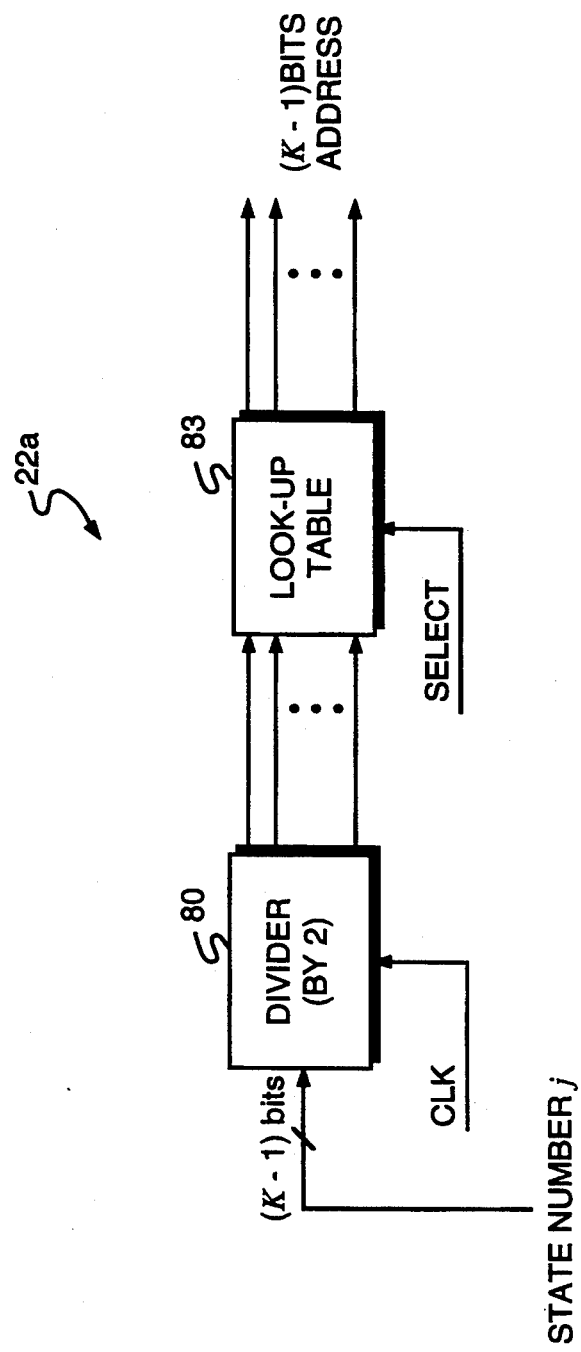
FIG. 8 depicts an alternative embodiment of the path metric memory address generation circuit of FIG. 7.

Alternatively, a look-up table 83, which contains the addresses of the previous states, may be used in place of the adder, as depicted in FIG. 8. The look-up table 83 is addressed by the output signals of the divider 80 and an asserted or de-asserted select signal. In response to the signals from the divider 80 and a de-asserted select signal, for example, the look-up table 83 produces the K-1 bit address associated with the first of the two previous states and in response to the signals from the divider 80 and an asserted select signal, the look-up table 83 produces the K-1 bit address associated with the second previous state.

Figure 9:
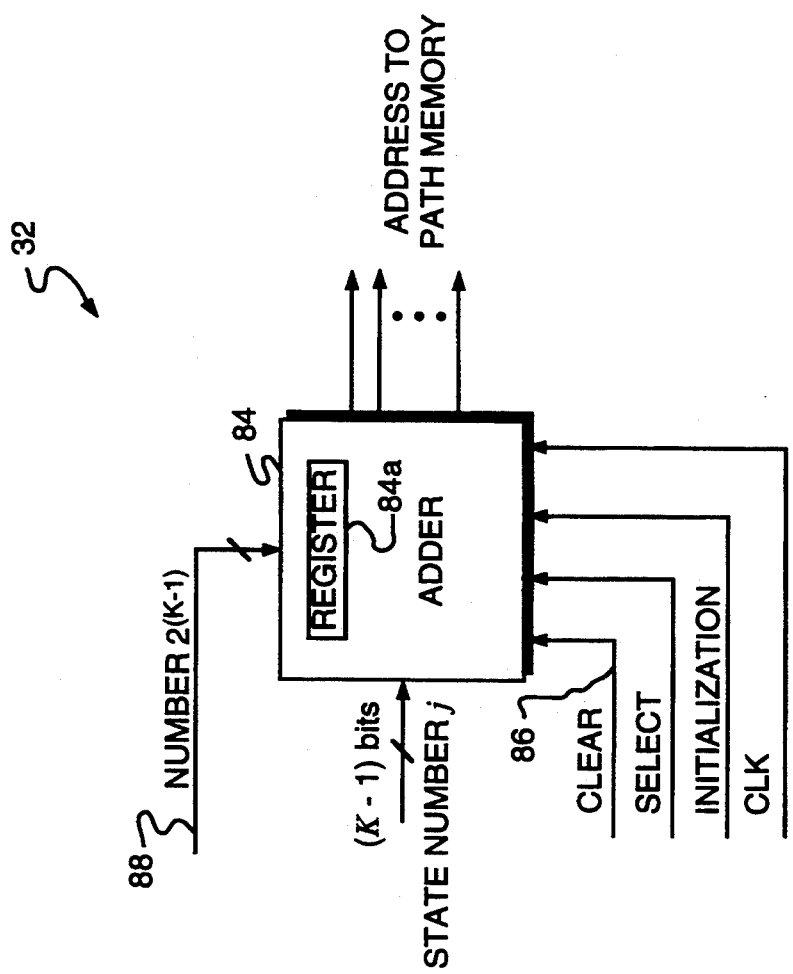
FIG. 9 depicts in block diagram form a path memory address generation circuit.

FIG. 9 depicts path memory address generation circuit 32 of FIG. 2 in more detail. This circuit, which generates the addresses for storage locations in path memory 34 consists of an adder 84 operated under various initial conditions. At the start of a code word stream, that is, at the start of establishing surviving paths, the adder 84 is cleared by the assertion of a clear signal over line 86. An internal register 84a is thus cleared to all ZEROS. The address circuit then adds the all-ZERO vector in register 84a to incoming state identifier numbers received from state counter 16 (FIG. 2) to produce the memory addresses for storage of the identifiers of the first states on the surviving paths. Thus, for the (2,1,2) code of the example, identifiers of the originating states of the branches leading to the end states of this first decoding level are stored in locations in the path memory 34 which correspond to the state numbers j=0, 1, 2, 3.

When the first level of decoding is completed, that is, when surviving paths to each of the end states have been determined, the adder generates a next set of addresses for the storage of path information relating to the decoding of a next code word. As discussed above, code word counter 24 (FIG. 2) counts the number of decoded code words by increasing its count when the state counter 16 (FIG. 2) reaches its maximum state count. Each time the code word counter 24 increases its count, it sends to adder 84 an asserted signal over line 88 and adder 84 adds the quantity $2^{K-1}$ to the contents of the internal register 84a. The adder 84 then adds to each incoming state number a vector which is the binary equivalent of $2^{(K-1)}$. For this second level of decoding the adder produces addresses which correspond to j+$2^{K-1}$, j=0 . . . 3.

When the second level of decoding is completed, the code word counter 24 (FIG. 2) again sends an asserted signal to the adder over line 88 and the adder updates the contents of its internal register 84a by adding to it the quantity $2^{K-1}$. The register 84a thus contains the quantity L($2^{K-1}$), where L corresponds to the number of the previous decoding level. The adder then produces for this next level of decoding a next set of addresses by adding the updated contents of the register 84a to the incoming state numbers. The adder 84 continues to generate addresses for the various levels of decoding by updating the contents of the internal register 84a and adding the contents to the incoming state numbers.

As discussed above, when the paths associated with a predetermined number of code words are determined, the decoder selects the most likely code word path and traces-back along the selected path to determine the associated data symbols. The decoder essentially re-uses the address generation circuit 32, that is, adder 84, to generate addresses to access the stored path-related information. However, the adder 84 functions, in effect, as a subtracter, generating from a known address the address of the storage location associated with a previous state on the path.

At the start of the trace-back operation, the decoder initializes the adder 84 by setting the internal register 84a to the binary equivalent of L($2^{K-1}$), which is the quantity added to the state numbers to form addresses for the current level of decoding. Before a trace-back address is generated, the decoder asserts the adder 84 select signal, which causes the adder to update its internal register by subtracting $2^{K-1}$ from the contents. The adder 84 is then ready to generate an address which corresponds to a previous, i.e., L-1, decoding level, and the selection signal is de-asserted.

The adder 84 next receives from the most likely path selection circuit 30 (FIG. 2) the state number of the last state on the selected most likely path. The adder 84 adds to this number the contents of the internal register 84a and generates the address of the memory location which has stored in it an identifier associated with the previous state on the path. The adder 84 then applies the address to the path memory 34, and accesses the stored identifier. The accessed information is sent to a data extraction circuit 36 (FIG. 2), for use in determining the decoded data as discussed below, and to the address generation circuit 32, for use in generating an address associated with the state which precedes the next-to-last state on the selected, or trace-back, path.

To prepare for the generation of the address of the preceding state, the adder 84 updates its internal register by subtracting from its contents the binary equivalent of $2^{K-1}$. The adder 84 then adds the state number of the next-to-last state to the updated contents of the internal register 84a, to produce an address for the path memory storage location. This location has stored in it information which identifies the next preceding state, and so forth, until all the states on the trace-back path have been identified.

Data extraction circuit 36 (FIG. 2) determines the associated data values for the branches on the trace-back path. The data extraction circuit 36 receives the state numbers from path memory 34 and extracts from them the appropriate data values. As can be seen from the decoding trellis of FIG. 1, the branches leading to an even end state are associated with ZERO data bits and the branches leading to an odd end state are associated with ONE data bits. The data extraction circuit 36 determines the data bit associated with a particular branch by extracting the least significant bit from the state number associated with the end state of the branch. The extraction circuit 36 extracts a "0" bit from an even state number and a "1" bit from an odd state number. The decoder thus does not require a separate memory for branch data values, as is required in known prior systems.

Figure 10:
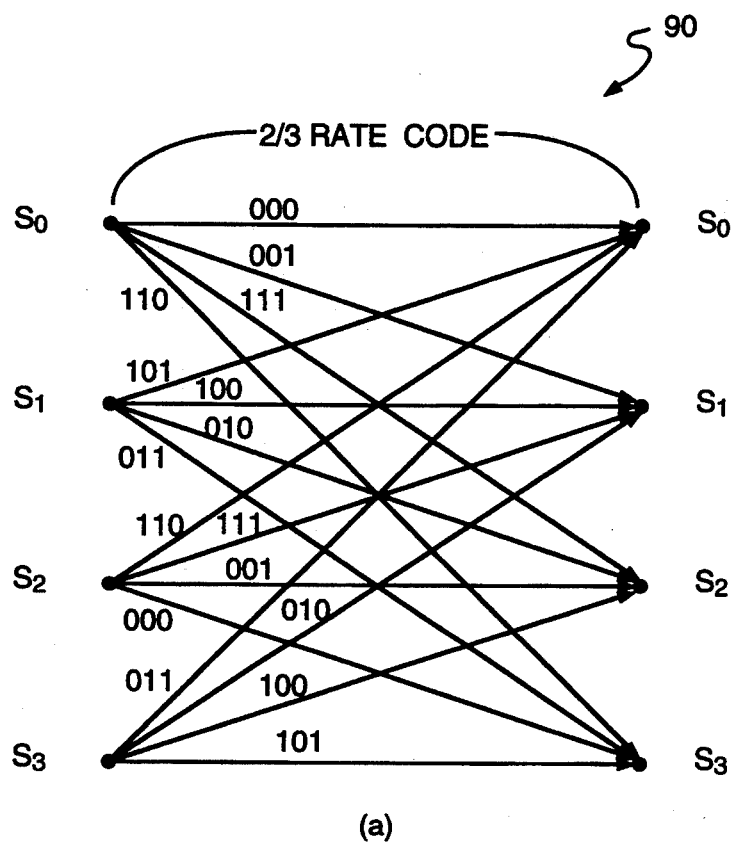
FIG. 10 illustrates a trellis for a (n-1)/n rate code.
Figure 10:
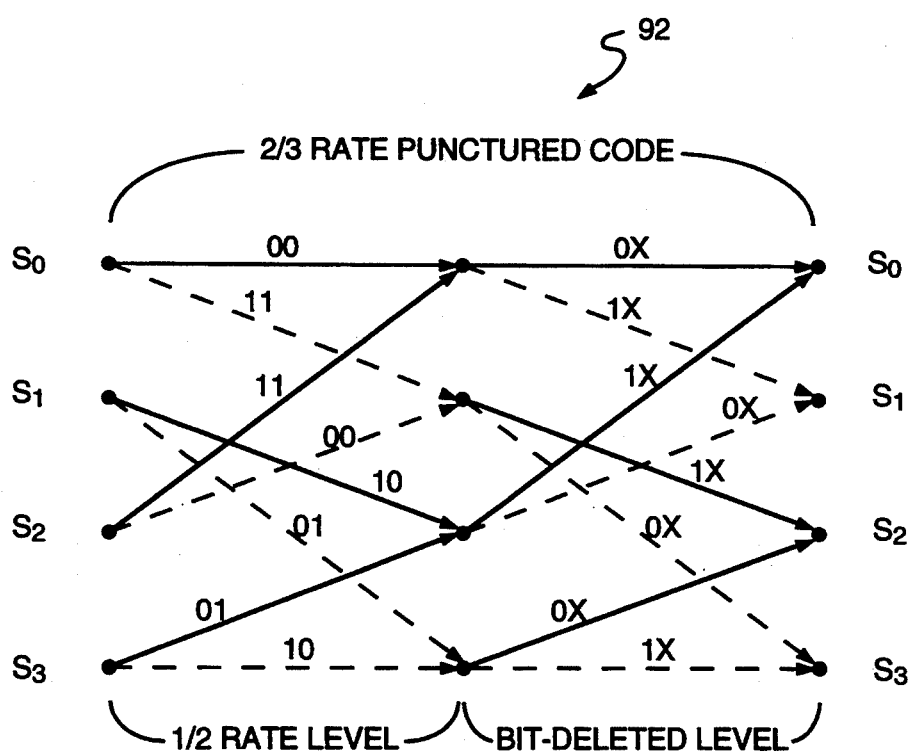

With minor modifications, the decoder can be used to decode code words of (n-1)/n rate codes. The decoder decodes these code words as part of "rate punctured" rate $\frac{1}{2}$ codes, where rate punctured refers to the deletion of certain bits from the code words of the $\frac{1}{2}$ rate code. A decoding trellis 90 for a $\frac{2}{3}$ rate code is depicted in FIG. 10a. A $\frac{2}{3}$ rate code encodes two data bits to produce a three-bit code word. A two-level decoding trellis 92 for a rate $\frac{1}{2}$ punctured code which corresponds to the $\frac{2}{3}$ rate code is illustrated in FIG. 10b, where X depicts deleted bits. The first level of the decoding trellis 92 corresponds to a full rate $\frac{1}{2}$ code decoding level and the second level of the decoding trellis 92 corresponds to a bit-deleted, one-bit to one-bit, decoding level. These two levels of decoding can be used to decode each code word of the $\frac{2}{3}$ rate code, with each decoding level determining one of the two associated data bits. Similarly, the decoder can be configured to decode a 4/5 rate code using for each code word a full rate $\frac{1}{2}$ decoding level, and three levels of bit-deleted, one-bit to one-bit, decoding levels. The decoder determines one data bit from the two most significant bits of the code word and second, third and fourth data bits from the next three code word bits.

Figure 11:
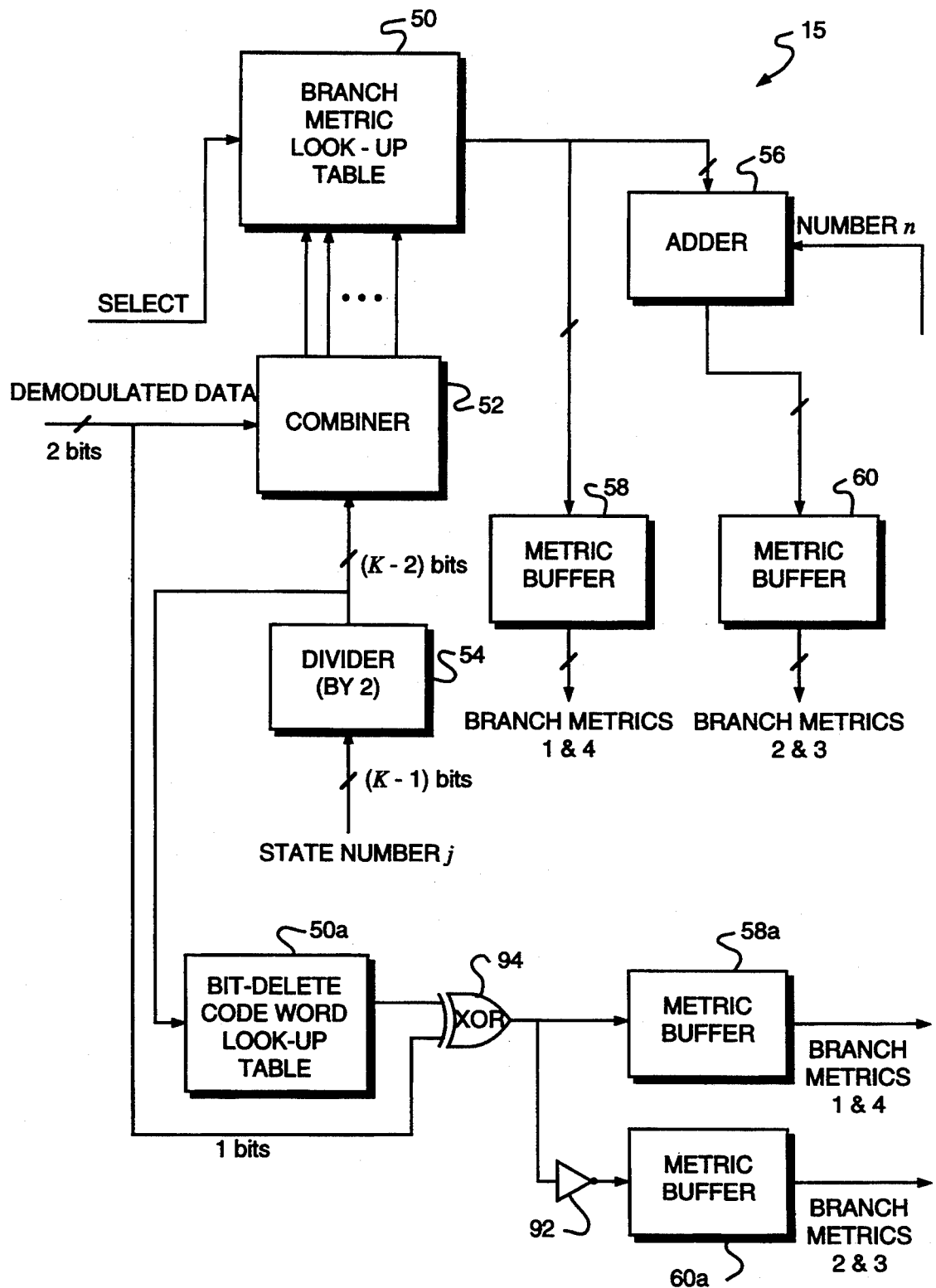
FIG. 11 illustrates a modified branch metric processor (hard decision decoding) for use with rate punctured decoding.

The branch metric processor 14 of FIG. 2 must be modified for use with the rate punctured code, as it must perform for each received n-bit code word n-1 levels of decoding. FIG. 11 depicts a modified branch metric processor 15 for the rate punctured decoding. The processor 15 includes, in addition to the circuitry of the branch processor 14 of FIG. 3, a $2^{K-2}$ element bit-deleted look-up table 50a, which contains the bit-deleted code words associated with the upper branch leading to each even state of a one-bit to one-bit decoding level. The processor 15 also includes an XOR gate 94, which essentially compares the bit-deleted code words retrieved from table 50a with the second bits of the transmitted code words, a one-bit storage element 58a for storing a first one-bit branch metric, an inverter 92 for inverting the first one-bit branch metric to form a second one-bit branch metric, and a second one-bit storage element 60a for storing the second one-bit branch metric.

When the branch metric processor 15 receives an n-bit transmitted code word, it uses the two most significant bits along with K-2 bits associated with the state numbers j to access from table 50 a branch metric for each even state associated with a first $\frac{1}{2}$ rate decoding level, in the same manner discussed with reference to FIG. 3. It then determines the second branch metrics for this level by subtracting in adder 56 the accessed branch metrics from two. These first and second metrics are stored in metric buffers 58 and 60, and the surviving paths for this $\frac{1}{2}$-rate decoding level are determined by ACS circuit 18 (FIG. 2), as discussed above.

The processor 15 next separately determines the branch metrics for the remaining n-2 code word bits, each of which is associated with a one-bit to one-bit, or bit-deleted, level of decoding. To calculate the branch metrics associated with the next, or third, most significant bit of the received code word the processor enters table 50a according to the K-2 bits associated with the state number of the first even state. In response, the table 50a produces an associated one-bit, or bit-deleted, code word.

The processor 15 next compares the bit-deleted code word with the received bit by exclusive-OR'ing them together in XOR gate 94. If the bits are the same, the XOR gate produces a metric of "0", otherwise, it produces a metric of "1." The processor stores the one-bit metric in metric buffer 58a and stores the inverse of the metric in metric buffer 60a. These metrics are then used by ACS circuit 18 to determine surviving paths for this first bit-deleted level of decoding. The processor 15 repeats this process for each of the remaining bits of the received code word.

The state counter 16 and the code word counter 24 of FIG. 2 must appropriately count the states and levels of decoding for each received code word. Thus the state counter 16 counts through $2^{K-1}$ states n-1 times for each received n-bit code word, and the code word counter registers an additional n-1 counts for each received code word. Accordingly, the clocks associated with the counters must be modified.

If the branch metric processors of FIGS. 4-5 are used in rate-punctured decoding, the bit-deleted code words can be determined directly from the code word memory 66 by selecting for each bit-deleted code word the most significant bit of a retrieved code word. The branch metrics associated with the bit-deleted levels of decoding are then determined using one of the XOR gates 64 to determine for each even state a first branch metric. The second branch metric is the binary inverse of the first branch metric.

Figure 12:
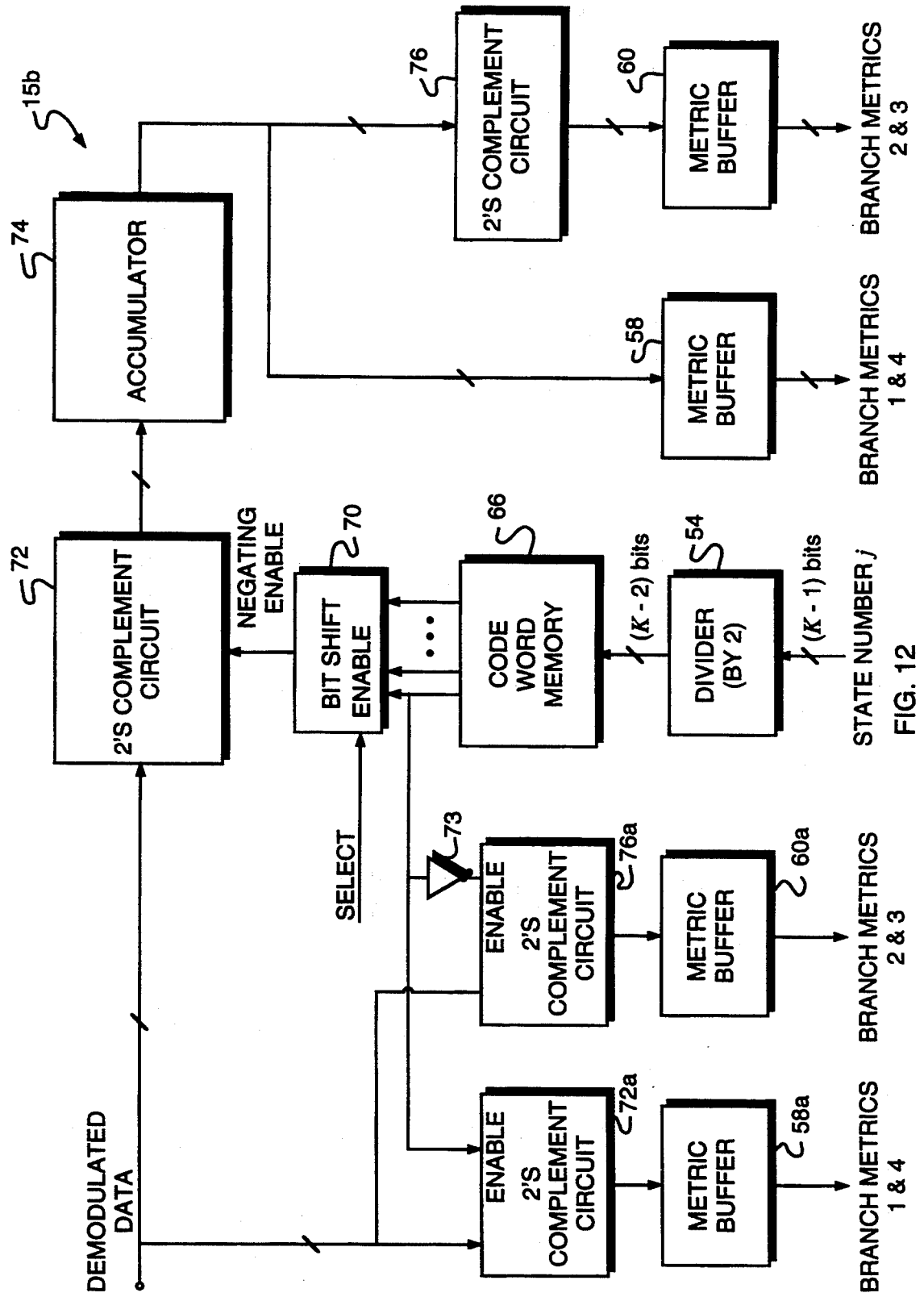
FIG. 12 illustrates a modified branch metric processor (soft decision decoding) for use with rate punctured decoding.

A soft decision decoder may also perform rate punctured decoding. Referring now to FIG. 12, branch metric processor 15c includes, in addition to the circuitry of branch processor 14c of FIG. 6, two 2's complement circuits 72a and 76a, an inverter 73 and two metric buffers 58a and 60a. The code words for the bit-deleted levels of decoding are the most significant bits of the code words stored in the code word memory 66.

The first $\frac{1}{2}$ rate level of soft decision decoding is performed in the same manner as the rate 1/n soft decoding discussed above with reference to FIG. 6. The processor uses for this level the two most significant bits of the received n-bit code word. The processor then determines the branch metrics for each of the remaining n-2 bits using a one-bit to one-bit, or bit deleted, level of decoding.

For bit deleted decoding, the processor 15b retrieves from the code word memory 66 a code word associated with the first even state and treats the most significant code word bit as the bit-deleted code word. The processor 15b next applies the bit-deleted code word to enable or disable the 2's complement circuit 72a and, through inverter 73, to disable or enable 2's complement circuit 76a. If, for example, the bit deleted code word is a ONE, it enables 2's complement circuit 72a and disables circuit 76a. Alternatively, if the bit-deleted code word is a ZERO, it disables circuit 72a and enables circuit 76a.

When a received bit signal is applied to these 2's complement circuits 72a and 76a, the circuits produce the first and second branch metrics, respectively, for the first even state. These metrics are also the second and first metrics of the related odd state. The processor thus calculates metrics only for the even states, as discussed above. The processor then repeats this procedure for each of the even states in the various bit-deleted decoding levels.

In summary, the decoder 10 (FIG. 2) performs maximum likelihood decoding using less complex circuitry than known prior systems. The decoder stores or calculates branch metrics for one of four branches leading to two consecutive states for each decoding level and determines the remaining branch metrics from these calculated metrics using relatively simple binary operations. The system thus simplifies and shortens the typically memory intensive or computation intensive process of determining branch metrics.

The decoder 10 also simplifies the addressing schemes used to access path metric and surviving path information by determining from the state number associated with an end state the path metric memory and path memory addresses associated with previous states on the surviving paths. Further, the decoder 10 eliminates the need for a memory dedicated to storing the date values associated with the various branches of the surviving paths by essentially determining data values from the identifiers, or state numbers, associated with the states on the most likely path.

We claim:

1. A maximum likelihood decoder for decoding a string of n-bit received code words encoded using a binary rate 1/n convolutional code of constraint length K, the decoder having for each code word $2^{K-1}$ end states and branches leading to the end states, the decoder including:
   A. a surviving path memory for storing, for each code word, identifiers of end states on $2^{K-1}$ surviving paths;
   B. a branch metric processor for
      i. determining, for each received code word, branch metrics corresponding to a portion of the branches leading to a portion of the $2^{K-1}$ end states, and
      ii. from these branch metrics determining the branch metrics associated with any remaining branches leading to the end $2^{K-1}$ states;
   C. accumulating means for accumulating, for each end state, the branch metrics for the branches leading to the end state and the path metrics for the previous states associated with the branches, the accumulating means determining path metrics for paths leading to the end state;
   D. selecting means for selecting a surviving path to each end state;
   E. a path metric memory for storing path metrics associated with the surviving paths;
   F. a path memory for storing information identifying the previous states on the selected paths;
   G. means for selecting a most likely path from the surviving paths associated with a predetermined number of code words; and
   H. a trace-back processor for tracing back along the branches of the most likely path and assigning a data value to each of the branches.

2. The maximum likelihood decoder of claim 1, wherein the branch metric processor
   a. calculates a branch metric associated with a first branch leading to each end state $S_j$, where $0 \leq j \leq 2^{K-1}$ and j is even; and
   b. subtracts this branch metric from n, wherein n is the number of bits in a code word, to determine a branch metric associated with a second branch leading to $S_j$.

3. The maximum likelihood decoder of claim 2, wherein the branch metric processor assigns to the branches leading to a state $S_{j+1}$ the branch metrics calculated and determined for state $S_j$ by associating with the first and second branches leading to state $S_{j+1}$ the metrics determined for the second and first branches, respectively, leading to state $S_j$.

4. The maximum likelihood decoder of claim 1, wherein the branch metric processor
   a. calculates a branch metric associated with a first branch leading to each end state $S_j$, where $0 \leq j \leq 2^{K-1}$ and j is even; and
   b. negates the branch metric associated with the first branch to determine a branch metric associated with a second branch leading to $S_j$.

5. The maximum likelihood decoder of claim 4, wherein the branch metric processor assigns to the branches leading to a state $S_{j+1}$ the branch metrics calculated and determined for state $S_j$ by associating with the first and second branches leading to state $S_{j+1}$ the metrics determined for the second and first branches, respectively, leading to state $S_j$.

6. The maximum likelihood decoder of claim 1, wherein the branch metric processor includes:
   i. a branch metric look-up table containing for every set of two consecutive even and odd states a single branch metric associated with a first branch leading to one of the end states in each of the sets,
   ii. branch look-up table addressing means for entering the branch metric look-up table, the look-up table addressing means formulating a table address for each of the even states,
   iii. processing means for producing for each branch metric retrieved from the look-up table a second branch metric associated with the same end state, the branch metric processor using the first and second branch metrics as the second and first metrics, respectively, for the other end state in the same set.

7. The maximum likelihood decoder of claim 6, wherein the branch metric look-up table addressing means produces, for a given even state, an address based on a state identifier, $S_j$, associated with the state and the associated n-bit received code word.

8. The maximum likelihood decoder of claim 6, wherein the processing means to produce the second branch metric subtracts the first branch metric from n, where n is the number of bits in the code word.

9. The maximum likelihood decoder of claim 6, wherein the processing means negates the first branch metric to produce the second branch metric.

10. The maximum likelihood decoder of claim 6, wherein the path metric memory stores path metrics associated with a given state in a memory location whose address is based on a state identifier, $S_j$, associated with the state.

11. The maximum likelihood decoder of claim 10, wherein the decoder further includes a path metric memory addressing means, the path metric memory addressing means producing addresses for path metrics associated with previous states on each of two paths leading to a current state, $S_j$, by manipulating the identifier of the current state
 i. for an address associated with the previous state on a first path producing $\{j/2\}$, where $\{\}$ represents the integer portion of $j/2$;
 ii. for an address associated with the previous state on a second path producing $\{j/2\}+2^{K-2}$.

12. The maximum likelihood decoder of claim 6, wherein the surviving path memory stores the identifier of the previous state on a surviving path in a location associated with a current level of decoding and the identifier of the end state on the path.

13. The maximum likelihood decoder of claim 12, wherein the surviving path memory stores the previous state identifier associated with the end state, $S_j$, in a location addressed by adding j to the product $L(2^{K-1})$, where L relates to the previous level of decoding.

14. The maximum likelihood decoder of claim 6, wherein the trace-back processor assigns to each branch of the most likely path which leads to an even end state a data value of 0 and to each branch which leads to an odd end state a data value of 1.

15. A maximum likelihood decoder for decoding a string of n-bit received code words encoded using a binary rate (n-1)/n convolutional code of constraint length K, the decoder segmenting each n-bit code word into a two-bit decoding code word and n-2 bit-deleted decoding code words, the decoder having for each decoding code word $2^{K-1}$ current states and branches leading to the current states, the decoder including:
 A. a surviving path memory for storing, for each decoding code word, identifiers of current states on $2^{K-1}$ surviving paths;
 B. a branch metric processor for
  i. determining, for each decoding code word, branch metrics corresponding to a portion of the branches leading to a portion of the $2^{K-1}$ current states, and
  ii. from these branch metrics determining the branch metrics associated with any remaining branches leading to the current states;
 C. accumulating means for accumulating, for each current state, the branch metrics for the branches leading to the current state and path metrics for previous states associated with the branches, the accumulating means determining path metrics for paths leading to the current state;
 D. selecting means for selecting a surviving path to each current state;
 E. a path metric memory for storing path metrics associated with the surviving paths;
 F. a path memory for storing information identifying the previous states on the selected paths;
 G. means for selecting a most likely path from the surviving paths associated with a predetermined number of code words; and
 H. a trace-back processor for tracing back along the branches of the most likely path and assigning a data value to each of the branches.

16. The maximum likelihood decoder of claim 15, wherein the branch metric processor
 a. determines branch metrics for branches associated with a two-bit decoding code word by:
  1. calculating a branch metric associated with a first branch leading to each current state $S_j$, where $0 \leq j \leq 2^{K-1}$ and j is even; and
  2. subtracting this branch metric from 2 to determine a branch metric associated with a second branch leading to $S_j$; and
 b. determines branch metrics for branches associated with a bit-deleted decoding code word by:
  1. determining a branch metric associated with a first branch leading to each current state $S_j$, where $0 \leq j \leq 2^{K-1}$ and j is even; and
  2. inverting this branch metric to determine a branch metric associated with a second branch leading to $S_j$.

17. The maximum likelihood decoder of claim 16, wherein the branch metric processor, for each decoding code word, assigns to the branches leading to a state $S_{j+1}$ the branch metrics calculated and determined for state $S_j$ by associating with the first and second branches leading to state $S_{j+1}$ the metrics determined for the second and first branches, respectively, leading to state $S_j$.

18. The maximum likelihood decoder of claim 16, wherein the branch metric processor, for each two-bit decoding code word
 a. calculates a branch metric associated with a first branch leading to each current state $S_j$, where $0 \leq j \leq 2^{K-1}$ and j is even; and
 b. negates the branch metric associated with the first branch to determine a branch metric associated with a second branch leading to $S_j$.

19. The maximum likelihood decoder of claim 18, wherein the branch metric processor assigns to the branches leading to a state $S_{j+1}$ the branch metrics calculated and determined for state $S_j$ by associating with the first and second branches leading to state $S_{j+1}$ the metrics determined for the second and first branches, respectively, leading to state $S_j$.

20. The maximum likelihood decoder of claim 15, wherein the branch metric processor includes:
 i. a branch metric look-up table containing for every set of two consecutive even and odd states corresponding to a two-bit decoding code word a first branch metric,
 ii. a branch metric look-up table addressing means for entering the branch metric look-up table, the look-up table addressing means formulating a table address for each of the even states corresponding to a two-bit decoding code word,
 iii. a bit-deleted code word look-up table containing for every set of two consecutive even and odd states a bit-deleted code word corresponding to a first branch associated with the even state;
 iv. a bit-deleted code word look-up table addressing means for entering the table, the addressing means formulating a table address for each of the even states;

v. a bit-deleted processing means for producing a first branch metric for each even state associated with a bit-deleted decoding code word, the bit-deleted processing means comparing the bit-deleted decoding code word with the code word retrieved from the bit-deleted code word look-up table and producing a branch metric of 0 if the two code words match or a branch metric of 1 if the two code words do not match;

vi. metric processing means for formulating from the first branch metric associated with an even state a second branch metric;

the branch metric processor using the first and second branch metrics as the second and first metrics, respectively, for the associated odd state.

21. The maximum likelihood decoder of claim 20, wherein the two-bit decoding code word branch metric look-up table addressing means produces, for a given even state, an address based on the state identifier and the associated two-bit decoding code word.

22. The maximum likelihood decoder of claim 20, wherein the metric processing means subtracts the first branch metric produced for a two-bit code word from 2 to produce the second branch metric associated with the given state and the two-bit code word.

23. The maximum likelihood decoder of claim 22, wherein the processing means negates the first branch metric produced for a two-bit code word to produce the second branch metric associated with the given state.

24. The maximum likelihood decoder of claim 20, wherein the bit-deleted code word look-up table addressing means produces, for a given even state associated with the bit-deleted decoding code word, an address based on a state identifier associated with the state.

25. The maximum likelihood decoder of claim 20, wherein the metric processing means, for each even state associated with a bit-deleted decoding code word, produces the second branch metric associated with an even state by inverting the first branch metric.

26. The maximum likelihood decoder of claim 20, wherein the path metric memory stores path metrics associated with a given state in a memory location whose address is based on a state identifier, $S_j$, associated with the state.

27. The maximum likelihood decoder of claim 26, wherein the decoder further includes a path metric memory addressing means, the path metric memory addressing means producing addresses for path metrics associated with a previous state on each of two paths leading to a current end state, $S_j$, by manipulating the identifier of the end state i. for an address associated with the previous state on a first path producing $\{j/2\}$, where $\{\}$ represents the integer portion of $j/2$;

ii. for an address associated with the previous state on a second path producing $\{j/2\}+2^{K-2}$.

28. The maximum likelihood decoder of claim 20, wherein the surviving path memory stores the identifier of the previous state on the surviving path leading to the current end state in a location associated with the current level of decoding and the state identifier of the end state.

29. The maximum likelihood decoder of claim 28, wherein the surviving path memory stores the previous state identifier associated with a current end state, $S_j$, in a location addressed by adding j to the product $L(2^{K-1})$, where L relates to a previous level of decoding.

30. The maximum likelihood decoder of claim 20, wherein the trace-back processor assigns to each branch of the most likely path leading to an even state a data value of 0 and to each branch leading to an odd state a data value of 1.

31. The maximum likelihood decoder of claim 15, wherein the branch metric processor includes:

i. a branch code word look-up table containing for every set of two consecutive even and odd states corresponding to a two-bit decoding code word a branch code word associated with a first branch, ii. a branch code word look-up table addressing means for entering the branch code word look-up table, the look-up table addressing means formulating a table address for each of the even states corresponding to a two-bit decoding code word, iii. means for determining a branch metric corresponding to the first branch, iv. a bit-deleted processing means for producing a first branch metric for each even state associated with a bit-deleted decoding code word, the bit deleted processing means comparing the bit-deleted decoding code word with a most significant bit of a corresponding branch code word retrieved from the branch code word look-up table and producing a branch metric of 0 if the two code words match or a branch metric of 1 if the two code words do not match;

v. metric processing means for formulating from the first branch metric associated with an even state a second branch metric;

the branch metric processor using the first and second branch metrics as the second and first metrics, respectively, for the associated odd state.

32. The maximum likelihood decoder of claim 31, wherein the branch code word look-up table addressing means produces, for a given even state, an address based on the state identifier.

33. The maximum likelihood decoder of claim 31, wherein the metric processing means subtracts the first branch metric produced for a two-bit code word from 2 to produce the second branch metric associated with the given state and the two-bit code word.

34. The maximum likelihood decoder of claim 33, wherein the processing means negates the first branch metric produced for a two-bit code word to produce the second branch metric associated with the given state.

35. The maximum likelihood decoder of claim 31, wherein the metric processing means, for each even state associated with a bit-deleted decoding code word, produces the second branch metric associated with an even state by inverting the first branch metric.

36. The maximum likelihood decoder of claim 31, wherein the path metric memory stores path metrics associated with a given state in a memory location whose address is based on a state identifier, $S_j$, associated with the state.

37. The maximum likelihood decoder of claim 36, wherein the decoder further includes a path metric memory addressing means, the path metric memory addressing means producing addresses for path metrics associated with a previous state on each of two paths leading to a current end state, $S_j$, by manipulating the identifier of the end state i. for an address associated with the previous state on a first path producing $\{j/2\}$, where $\{\}$ represents the integer portion of $j/2$;

ii. for an address associated with the previous state on a second path producing $\{j/2\}+2^{K-2}$.

38. The maximum likelihood decoder of claim 31, wherein the surviving path memory stores the identifier of the previous state on the surviving path leading to the current state in a location associated with the current level of decoding and the state identifier of the end state.

39. The maximum likelihood decoder of claim 38, wherein the surviving path memory stores the previous state identifier associated with a current end state, $S_j$, in a location addressed by adding j to the product $L(2^{K-1})$, where L relates to a previous level of decoding.

40. The maximum likelihood decoder of claim 31, wherein the trace-back processor assigns to each branch of the most likely path leading to an even state a data value of 0 and to each branch leading to an odd state a data value of 1.

41. A branch metric processor for use with a maximum likelihood decoder that decodes a string of n-bit received code words encoded using a binary rate 1/n convolutional code of constraint length K by segmenting each n-bit code word into a two-bit decoding code word and n-2 bit-deleted decoding code words, associating with each decoding code word $2^{K-1}$ end states and branches leading to the end states, and determining from branch metrics produced by the branch metric processor data values for the code words, the branch metric processor including:

i. first branch metrics means for calculating, for each received code word, branch metrics corresponding to a portion of the branches leading to a portion of the $2^{K-1}$ end states, ii. second branch metrics means for determining, from the branch metrics determined by the first branch metric means, the branch metrics associated with the remaining branches leading to the $2^{K-1}$ end states, and iii. means for outputting the branch metrics to the decoder.

42. The maximum likelihood decoder of claim 41, wherein the branch metric processor a. calculates a branch metric associated with a first branch leading to each end state $S_j$, where $0 \leq j \leq 2^{K-1}$ and j is even; and b. subtracts this branch metric from n to determine a branch metric associated with a second branch leading to $S_j$.

43. The maximum likelihood decoder of claim 42, wherein the branch metric processor assigns to the branches leading to a state $S_{j+1}$ the branch metrics calculated and determined for state $S_{j+1}$ by associating with the first and second branches leading to state $S_{j+1}$ the metrics determined for the second and first branches, respectively, leading to state $S_j$.

44. The maximum likelihood decoder of claim 41, wherein the branch metric processor a. calculates a branch metric associated with a first branch leading to each end state $S_j$, where $0 \leq j \leq 2^{K-1}$ and j is even; and b. negates the branch metric associated with the first branch to determine a branch metric associated with a second branch leading to $S_j$.

45. The maximum likelihood decoder of claim 44, wherein the branch metric processor assigns to the branches leading to a state $S_{j+1}$ the branch metrics calculated and determined for state $S_j$ by associating with the first and second branches leading to state $S_{j+1}$ the metrics determined for the second and first branches, respectively, leading to state $S_j$.

46. A branch metric processor for use with a maximum likelihood decoder which decodes a string of n-bit received code words each of which is encoded using a binary rate (n-1)/n convolutional code of constraint length K and segmented into a two-bit decoding code word and n-2 bit-deleted decoding code words, each of the code words being associated with $2^{K-1}$ current states and branches leading to the current states, and determining from branch metrics produced by the branch metric processor data values for the code words, the branch metric processor including:

i. first branch metrics means for determining, for each decoding code word, the branch metrics corresponding to a portion of the branches leading to a portion of $2^{K-1}$ current states, ii. second branch metrics means for determining, from the branch metrics determined by the first branch metric means, the branch metrics associated with the remaining branches leading to the $2^{K-1}$ current states, and iii. means for outputting the branch metrics to the decoder.

47. The branch metric processor of claim 46, wherein a. the first branch metric means calculating branch metrics for branches associated with a two-bit decoding code word by calculating a branch metric associated with a first branch leading to each current state $S_j$, where $0 \leq j \leq 2^{K-1}$ and j is even; and b. the second branch metric means determines branch metrics associated with state $S_j$ by subtracting the branch metric determined by the first branch metric means from 2.

48. The branch metric processor of claim 46, wherein a. the first branch metric means determines branch metrics for branches associated with a bit-deleted decoding code word by calculating a branch metric associated with a first branch leading to each current state $S_j$, where $0 \leq j \leq 2^{K-1}$ and j is even; and b. the second branch metric means determines branch metrics associated with state $S_j$ by negating the branch metric determined by the first branch metric means.

49. The maximum likelihood decoder of claim 48, wherein the branch metric processor, for each decoding code word, assigns to the branches leading to a state $S_{j+1}$ the branch metrics calculated and determined for state $S_j$ by associating with the first and second branches leading to state $S_{j+1}$ the metrics determined for the second and first branches, respectively, leading to state $S_j$.

* * * * *